United States Patent
Chiang et al.

(10) Patent No.: US 6,172,519 B1
(45) Date of Patent: *Jan. 9, 2001

(54) BUS-HOLD CIRCUIT HAVING A DEFINED STATE DURING SET-UP OF AN IN-SYSTEM PROGRAMMABLE DEVICE

(75) Inventors: David Chiang, Saratoga; Jesse H. Jenkins, IV, Danville; Robert A. Olah, Palo Alto, all of CA (US)

(73) Assignee: Xilinx, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/993,596

(22) Filed: Dec. 18, 1997

(51) Int. Cl.[7] .................................................. H03K 19/173
(52) U.S. Cl. .................................................. 326/38; 326/82
(58) Field of Search .................................................. 326/17, 38, 82, 326/86, 90

(56) References Cited

U.S. PATENT DOCUMENTS

| | | | |
|---|---|---|---|
| 4,758,985 | * 7/1988 | Carter | 326/40 |
| 4,766,334 | * 8/1988 | Warner | 326/86 |
| 4,902,917 | * 2/1990 | Simpson | 326/38 |
| 5,426,650 | 6/1995 | Ganapathy et al. | 371/22.3 |
| 5,506,517 | 4/1996 | Tsui et al. | 326/39 |
| 5,511,170 | * 4/1996 | Abdoo | 395/280 |
| 5,617,040 | 4/1997 | Matthews | 326/38 |
| 5,656,953 | 8/1997 | Whetsel | 326/83 |
| 5,668,482 | * 9/1997 | Roskell | 326/17 |
| 5,684,411 | * 11/1997 | Nepple | 326/38 |
| 5,764,075 | * 6/1998 | Fukushima | 326/38 |

FOREIGN PATENT DOCUMENTS

WO 96/35263  11/1996  (WO).

* cited by examiner

Primary Examiner—Jon Santamauro
(74) Attorney, Agent, or Firm—Bever, Hoffman & Harms, LLP; Jeanette S. Harms; Lois D. Cartier

(57) ABSTRACT

A method of operating a pin of an in-system programmable logic device (ISPLD) which includes the steps of (1) applying a predetermined voltage to the pin when the ISPLD is in a set-up mode, and (2) maintaining the last voltage applied to the pin when the ISPLD is in a normal operating mode. The ISPLD is in the set-up mode when the logic of the ISPLD has not yet been configured, or is being configured. The ISPLD is in the normal operating mode after the logic of the ISPLD has been configured. A particular ISPLD includes a pin and a logic gate having a first input terminal coupled to the pin, a second input terminal coupled to receive a control signal, and an output terminal coupled to the pin. When the ISPLD is in the set-up mode, the control signal causes the logic gate to apply a predetermined voltage to the pin. When the ISPLD is in the normal operating mode, the control signal causes the logic gate to maintain the last applied voltage on the pin.

14 Claims, 5 Drawing Sheets

BUS-HOLD CIRCUIT HAVING A DEFINED STATE DURING SET-UP OF AN IN-SYSTEM PROGRAMMABLE DEVICE

BACKGROUND OF THE INVENTION

1. Field of the Invention

The present invention relates to a bus-hold circuit for controlling the voltage on a pin of an in-system programmable logic device during both set-up and normal operation of the device.

2. Discussion of Related Art

In-system programmable logic devices (ISPLDs) are integrated circuit chips which are typically installed on a printed circuit board with other integrated circuit chips. The programmable logic of the ISPLD can be, for example, a field programmable gate array (FPGA) or complex programmable logic device (CPLD). ISPLDs typically operate in two distinct modes, namely, a set-up mode and a normal operating mode. The set-up mode includes two sub-modes. One sub-mode is a non-programmed sub-mode, in which the logic of the ISPLD has not yet been configured (i.e., not yet programmed). The second sub-mode is a configuration sub-mode, during which the logic of the ISPLD is configured (i.e., programmed) in accordance with conventional techniques. During the normal operating mode, the ISPLD has already been configured, and the ISPLD is receiving input signals and providing output signals to external devices in accordance with the particular configuration of the ISPLD.

The configuration sub-mode can be entered while the ISPLD is 'in-system'. That is, the ISPLD can be configured while connected to other integrated circuit chips in the system. As a result, .ISPLDs provide operating flexibility.

Conventional ISPLDs include input/output (I/O) pins. Within some ISPLDs, each of the I/O pins is connected to an associated bus-hold circuit. Within other ISPLDs, each of the I/O pins is connected to an associated pull-up resistor circuit. Bus-hold circuits and pull-up resistor circuits prevent the I/O pins from being in a floating state. A floating state is defined as a state in which a pin is not connected to any of the supply voltages of the circuit. As a result, the logic state of a pin is indeterminate while the pin is in a floating state. As described in more detail below, both pull-up resistor circuits and bus-hold circuits have deficiencies.

FIG. 1 is a schematic diagram of a conventional bus-hold circuit 100 which is coupled to an I/O pin 101, an input stage 102 and an output stage 103 of an ISPLD. In the illustrated diagram, input stage 102 is a CMOS inverter and output stage 103 is a tri-stateable CMOS inverter. The bus-hold circuit 100 includes cross-coupled CMOS inverters 104–105 and resistor 106. During normal operation of bus-hold circuit 100, inverters 104 and 105 operate as a latch to store the state of the last signal applied to pin 101.

The state of the signal provided by bus-hold circuit 100 cannot be guaranteed when the ISPLD is in the set-up mode. That is, bus-hold circuit 100 may provide either a logic high signal or a logic low signal to I/O pin 101 (in response to signals provided to the bus-hold circuit) when the ISPLD has not yet been configured, or when the ISPLD is being configured. If the ISPLD is connected to other integrated circuit chips on a printed circuit board at this time, such an output signal can cause these other integrated circuit chips to operate in an undesired manner. For example, a signal having a particular logic state provided at an I/O pin of the ISPLD could instruct an attached integrated circuit chip to launch a missile.

As previously mentioned, other ISPLDs have I/O pins which are coupled to pull-up resistor circuits. A conventional pull-up resistor circuit includes a resistor coupled between the I/O pin and the Vcc voltage supply rail. The pull-up resistor circuit therefore holds the I/O pin at a logic high voltage (i.e., Vcc) when the ISPLD is in the set-up mode. As a result, the I/O pin (which is defined to have an active low output), does not drive any external circuits when the ISPLD is in the set-up mode.

However, problems can arise when using a pull-up resistor circuit with an I/O pin, especially when the pin is coupled to a tri-state bus. FIG. 2 is a schematic diagram of a conventional pull-up resistor circuit 200 which includes pull-up resistor 201 connected to Vcc voltage supply rail 202. Pull-up resistor 201 is also connected to a line which extends between I/O pin 203, input stage 204 and output stage 205. Input stage 204 is a CMOS inverter, and output stage 205 is a tri-stateable CMOS inverter in the described example. Pull-up resistor circuit 200, I/O pin 203 and input stage 204 are part of an ISPLD 206.

When ISPLD 206 is in the set-up mode, pull-up resistor 201 causes I/O pin 203 to be maintained at a well-defined logic high level (i.e., Vcc). However, as described in more detail below, pull-up resistor 201 causes problems in the normal operating mode when I/O pin 203 is coupled to a tri-state bus.

As further illustrated in FIG. 2, I/O pin 203 is connected to a tri-state bus 210. Tri-state bus 210 is controlled to be in one of three states, namely, a high voltage state, a low voltage state or a high-impedance state (i.e., tri-state). Tri-state bus 210 is controlled by input driver circuit 211 and capacitor 212. Other CMOS devices 221 and 222 are also connected to tri-state bus 210.

Tri-state bus 210 is placed in the high voltage state by applying a logic low output enable (OE bar) signal and a logic high data (D) signal to driver circuit 211. The logic low OE bar signal enables driver circuit 211 to pass the logic high data signal to tri-state bus 210.

Tri-state bus 210 is placed in the low voltage state by applying a logic low OE bar signal and a logic low data signal to driver circuit 211. The logic low OE bar signal enables driver circuit 211 to pass the logic low data signal to tri-state bus 210.

Tri-state bus 210 is placed in the high-impedance state by applying a logic high OE bar signal to driver circuit 211. Driver circuit 211 is disabled by the logic high OE bar signal, thereby preventing driver circuit 211 from asserting any voltage on tri-state bus 210.

During normal operation, tri-state bus 210 may transition from a low voltage state to a high-impedance state. When tri-state bus 210 enters the high-impedance state from the low voltage state, pull-up resistor 201 begins to raise the voltage on tri-state bus 210 from the low voltage state to Vcc. Because tri-state bus 210 is heavily loaded, the resultant rise time of the bus voltage can be very large (e.g., up to the order of one millisecond). This rise time is undesirable because CMOS circuits 221 and 222 will have their input voltages slowly swept through their trip points simultaneously, thereby resulting in excessive current.

It would be desirable to have an ISPLD which maintains the I/O pins of an ISPLD in a well-defined state while the ISPLD is in the set-up mode, and which maintains the I/O pins of an ISPLD in their last driven state when the ISPLD is in the normal operating mode.

SUMMARY

Accordingly, the present invention provides an ISPLD which applies a predetermined voltage to the I/O pins when the ISPLD is in the set-up mode, and which maintains the last voltage applied to each of the I/O pins when the ISPLD is in the normal operating mode.

In a particular embodiment the ISPLD includes a logic gate coupled to an I/O pin. The logic gate has a first input terminal coupled to the pin, a second input terminal coupled to receive a control signal, and an output terminal coupled to the pin. The control signal is controlled to have a first logic state when the ISPLD is in the set-up mode, and a second logic state when the ISPLD is in the normal operating mode.

The logic gate applies a predetermined voltage to the pin when the control signal is in the first logic state. For example, the logic gate can apply a logic high voltage to the pin when the control signal is in the first logic state. This configuration is equivalent to coupling the pin to a pull-up resistor circuit. As a result, the pin is advantageously coupled to a predetermined voltage while the ISPLD is in the set-up mode.

The logic gate maintains the last applied voltage on the pin when the control signal is in a second logic state. For example, the logic gate applies a logic low voltage to the pin if the last signal applied to the pin had a logic low voltage. This configuration is equivalent to coupling the pin to a conventional bus-hold circuit. As a result, the pin is advantageously coupled to a bus-hold circuit while the ISPLD is in the normal operating mode.

In one variation, the logic gate is coupled to a control circuit which is programmable to override the previously described operations, and cause the logic gate to continuously operate as a pull-up resistor circuit. In another variation, the control circuit is programmable to override the previously described operations, and cause the logic gate to continuously operate as a bus-hold circuit.

The present invention will be more fully understood in view of the following description and drawings.

DETAILED DESCRIPTION

Figure 1:
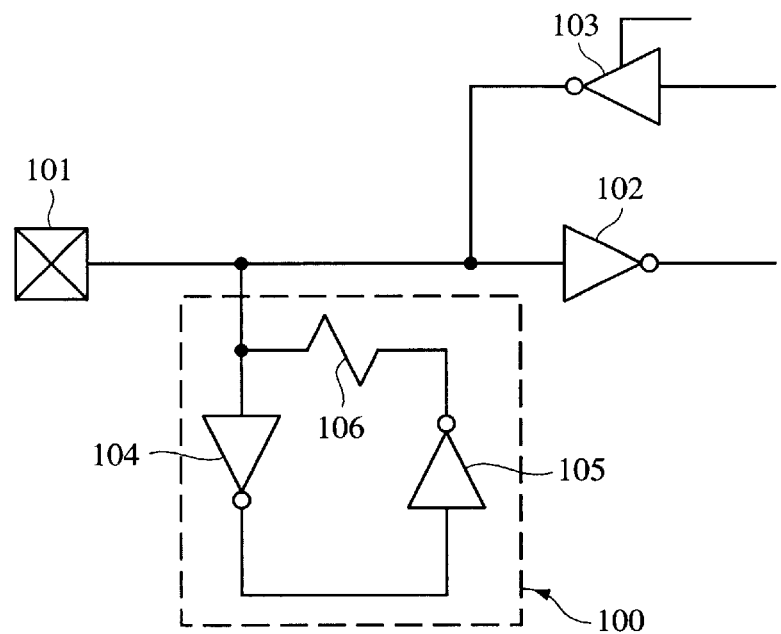
FIG. 1 is a schematic diagram of a conventional bus-hold circuit.
Figure 2:
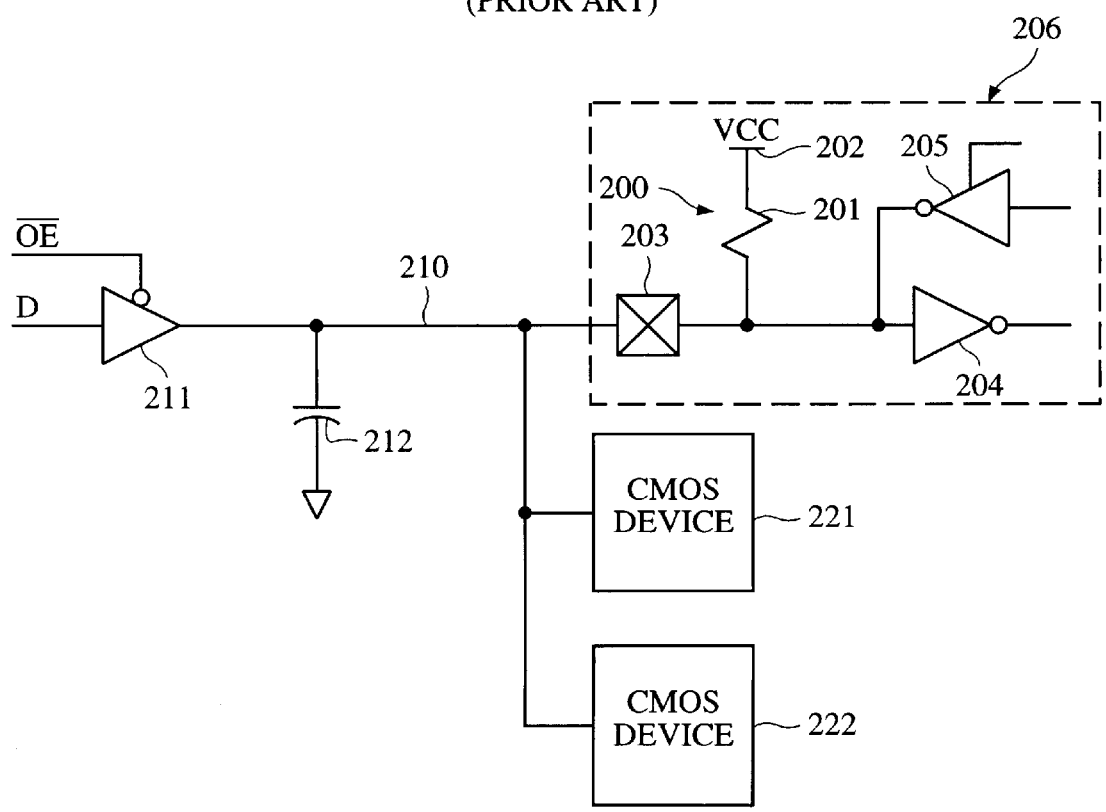
FIG. 2 is a schematic diagram of a conventional pull-up resistor circuit.
Figure 3:
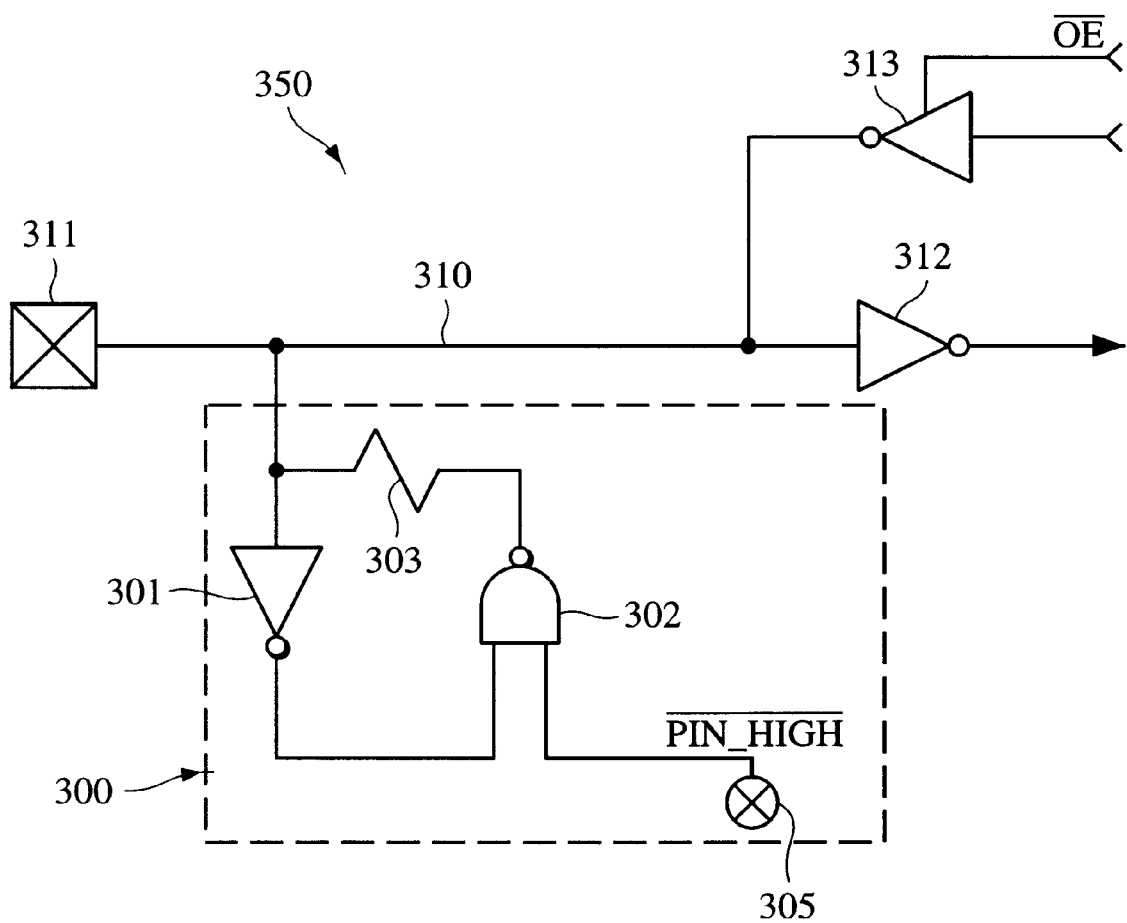
FIG. 3 is a schematic diagram of a bus-hold circuit in accordance with one embodiment of the invention.

FIG. 3 is a schematic diagram of a bus-hold circuit 300 in accordance with one embodiment of the present invention. Bus-hold circuit 300 includes inverter 301, NAND gate 302 and resistor 303. In the described embodiment, inverter 301 is a conventional CMOS inverter. The output terminal of inverter 301 is connected to one of the input terminals of NAND gate 302. The other input terminal of NAND gate 302 is connected to receive a control signal PIN_HIGH bar. The output terminal of NAND gate 302 is connected to one terminal of resistor 303. The other terminal of resistor 303 is connected to the input terminal of inverter 301.

The input terminal of inverter 301 is also connected to a bus line 310. Bus line 310, in turn, is connected between an I/O pin 311, an input stage 312 and an output stage 313 of ISPLD 350. In the described embodiment, input stage 312 is a CMOS inverter and output stage 313 is a tri-stateable CMOS inverter. ISPLD 350 can be configured such that pin 311 is either an input pin or an output pin. If pin 311 is configured as an input pin, then input stage 312 is actively used, and output stage 313 is disabled. Conversely, if pin 311 is configured as an output pin, then output stage 313 is enabled, and input stage 312 is not actively used.

ISPLD 350 operates in two distinct modes, namely, a set-up mode and a normal operating mode. As previously described, the set-up mode includes a non-programmed sub-mode and a configuration sub-mode. In the non-programmed sub-mode, the logic of ISPLD 350 is not yet configured. During the configuration sub-mode, the logic of ISPLD 350 is configured in accordance with conventional techniques. During the normal operating mode, the logic of ISPLD 350 has already been configured. At this time, ISPLD 350 receives input signals and provides output signals to external devices in accordance with the particular configuration of ISPLD 350.

The state of the control signal PIN_HIGH bar controls the operation of bus-hold circuit 300. As described in more detail below, a logic low PIN_HIGH bar signal causes the bus hold circuit 300 to operate as a pull-up resistor circuit which provides a well-defined logic high state to pin 311. The PIN_HIGH bar signal is controlled to have a logic low state when ISPLD 350 is in the set-up mode. Also, as described in more detail below, a logic high PIN_HIGH bar signal causes bus-hold circuit 300 to operate as a conventional bus-hold circuit. The PIN_HIGH bar signal is controlled to have a logic high state when ISPLD 350 is in the normal operating mode.

In one embodiment of the present invention, the control signal PIN_HIGH bar is supplied by a configuration latch 305 located on ISPLD 350. This configuration latch 305 is a nonvolatile memory cell which is initially programmed to store a logic low value. After a valid configuration has been programmed into ISPLD 350, the nonvolatile memory cell is programmed to store a logic high value. When the valid configuration is erased from ISPLD 350 (i.e., ISPLD 350 is cleared), the configuration latch is programmed to store a logic low value.

The following example illustrates the operation of bus-hold circuit 300. Initially, the logic of ISPLD 350 has not been configured and configuration latch 305 has been programmed to store a logic low value. At this time, ISPLD 350 is in the non-programmed sub-mode. When ISPLD 350 is powered up, configuration latch 305 provides a logic low PIN_HIGH bar signal (e.g., 0 Volts). In response to this logic low PIN_HIGH bar signal, NAND gate 302 provides a logic high output signal to bus line 310 and pin 311 through resistor 303. Under these conditions, bus-hold circuit 300 is equivalent to a conventional pull-up resistor circuit. Thus, bus 310 and pin 311 are held at a predetermined, logic high voltage level when ISPLD 350 is powered up (i.e., during the initial non-programmed sub-mode). Pin 311 is defined to be active when in a logic low state. Because pin 311 is maintained at a logic high level during the non-programmed sub-mode, pin 311 advantageously does not drive any external devices during the non-programmed sub-mode.

The logic of ISPLD 350 is then configured in accordance with conventional techniques. During the configuration sub-mode, configuration latch 305 continues to store a logic low value. As a result, the PIN_HIGH bar signal remains at a logic low level, thereby causing bus 310 and pin 311 to remain at the predetermined, logic high voltage level while ISPLD 350 is configured. Advantageously, pin 311 does not drive any external devices during the configuration sub-mode.

At the end of the configuration sub-mode (i.e., after ISPLD 350 has been configured), configuration latch 305 is programmed to store a logic high value, thereby causing the PIN_HIGH bar signal to have a logic high state. At this time, ISPLD 350 enters the normal operating mode. In response to the logic high PIN_HIGH bar signal, bus-hold circuit 300 operates in the same manner as a conventional bus-hold circuit. More specifically, the logic high PIN_HIGH bar signal causes NAND gate 302 to operate as an inverter in response to the output signal provided by inverter 301.

If I/O pin 311 is to be configured as in input pin, output stage 313 is disabled. Output stage 313 is disabled by providing a logic high control signal OE bar to output stage 313. The logic high OE bar signal causes output stage 313 to enter a high-impedance state. The OE bar signal can be generated in various ways. For example, the OE bar signal can be provided by a configuration latch similar to configuration latch 305. Alternatively, the OE bar signal can be provided by selectively routing a logic high signal or a logic low signal through a multiplexer in response to a value stored in a configuration latch.

When I/O pin 311 is configured as an input pin, a logic high signal applied to pin 311 is also provided to the input terminal of inverter 301. In response, inverter 301 provides a logic low signal to the first input terminal of NAND gate 302. Because the second input terminal of NAND gate 302 is connected to the logic high PIN_HIGH bar signal, NAND gate 302 provides a logic high output signal to the input terminal of inverter 301. As a result, the logic high signal applied to pin 311 is latched by bus-hold circuit 300. That is, bus-hold circuit 300 maintains a logic high voltage on pin 311 until the input signal applied to pin 311 changes state. The value of resistor 303 is selected to enable the input signal applied to pin 311 to change the state of bus-hold circuit 300. Typically, the value of resistor 303 is between 2k and 20k Ohms, and in one embodiment is approximately 10k Ohms.

Similarly, when a logic low signal is applied to pin 311, inverter 301 provides a logic high signal to the first input terminal of NAND gate 302. Because the second input terminal of NAND gate 302 is connected to the logic high PIN_HIGH bar signal, NAND gate 302 provides a logic low output signal to the input terminal of inverter 301. As a result, the logic low signal applied to pin 311 is latched by bus-hold circuit 300. That is, bus-hold circuit 300 maintains a logic low voltage on pin 311 until the input signal applied to pin 311 changes state.

If pin 311 is to be configured as an output pin, output stage 313 is enabled. Output stage 313 is enabled by providing a logic low control signal OE bar to output stage 313. In this case, bus-hold circuit 300 operates in the manner previously described, except that output stage 313 (instead of the signal applied to pin 311) drives the state of bus-hold circuit 300.

When the configuration stored by ISPLD 350 is erased (i.e., cleared), configuration latch 305 is programmed to store a logic low value. Operation then continues as previously described. Note that the configuration stored by ISPLD 350, as well as the state of configuration latch 305, are nonvolatile (i.e., are not erased when ISPLD 350 is turned off).

Figure 4:
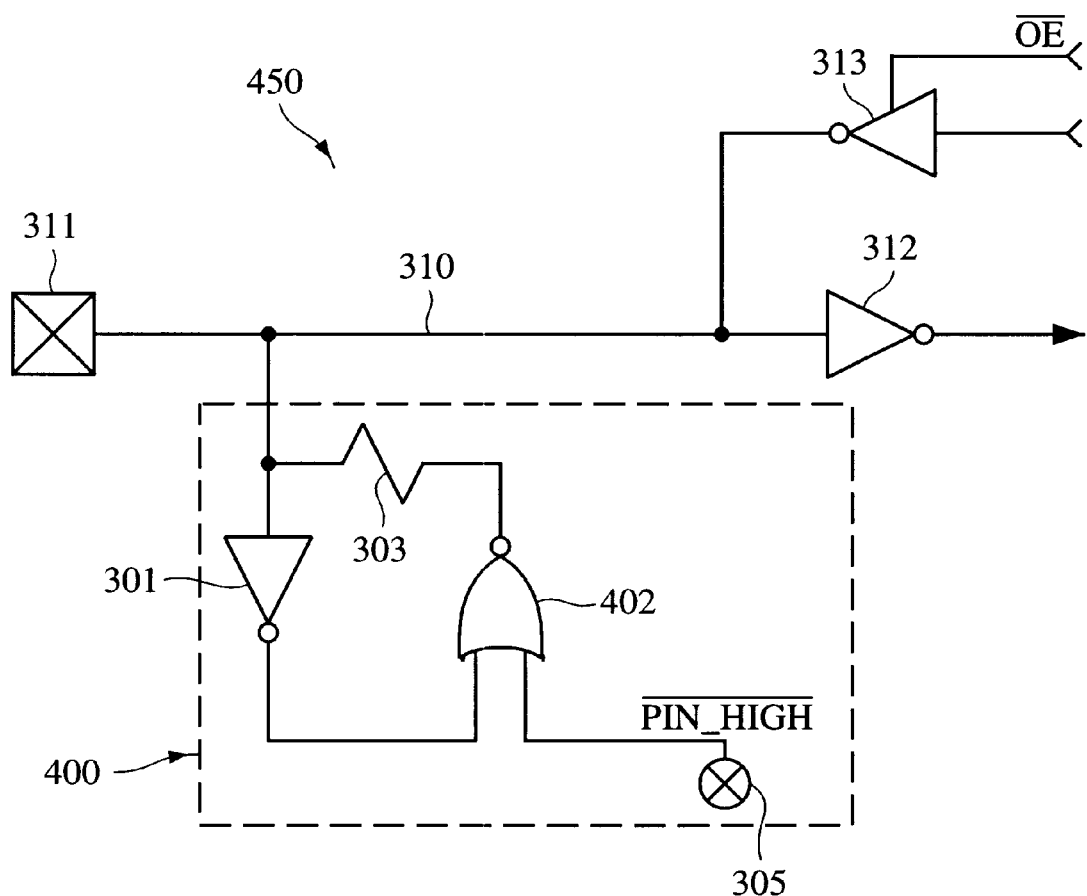
FIG. 4 is a schematic diagram of a bus-hold circuit in accordance with another embodiment of the invention.

FIG. 4 illustrates an ISPLD 450 having a bus-hold circuit 400 in accordance with another embodiment of the present invention. Because ISPLD 450 is similar to ISPLD 350 (FIG. 3), similar elements in FIGS. 3 and 4 are labeled with similar reference numbers. Thus, ISPLD 450 includes I/O pin 311, bus 310, input stage 312 and output stage 313. Similarly, bus-hold circuit 400 includes inverter 301, resistor 303 and configuration latch 305. However, bus-hold circuit 400 replaces the NAND gate 302 of bus-hold circuit 300 with a NOR gate 402.

In bus-hold circuit 400, configuration latch 305 is initially programmed with a logic high value. Consequently, during the initial set-up mode the PIN_HIGH bar signal initially has a logic high value. In response to the logic high PIN_HIGH bar signal, NOR gate 402 provides a logic low voltage (as opposed to a logic high voltage) to pin 311. Thus, bus-hold circuit 400 operates as a pull-down resistor circuit during the initial set-up mode. In the present embodiment, pin 311 is defined to be active high. Thus, pin 311 does not undesirably drive any external circuits during the initial set-up mode.

After ISPLD 450 has been configured, configuration latch 305 is programmed to store a logic low value. As a result, the PIN_HIGH bar signal has a logic low value when ISPLD 450 enters the normal operating mode. The logic low PIN_HIGH bar signal causes NOR gate 402 to operate as an inverter in response to the signal provided at the output terminal of inverter 301. Thus, bus-hold circuit 400 operates as a conventional bus-hold circuit during the normal operating mode. When the configuration of ISPLD 450 is erased, configuration latch 305 is re-programmed to store a logic high value.

Figure 5:
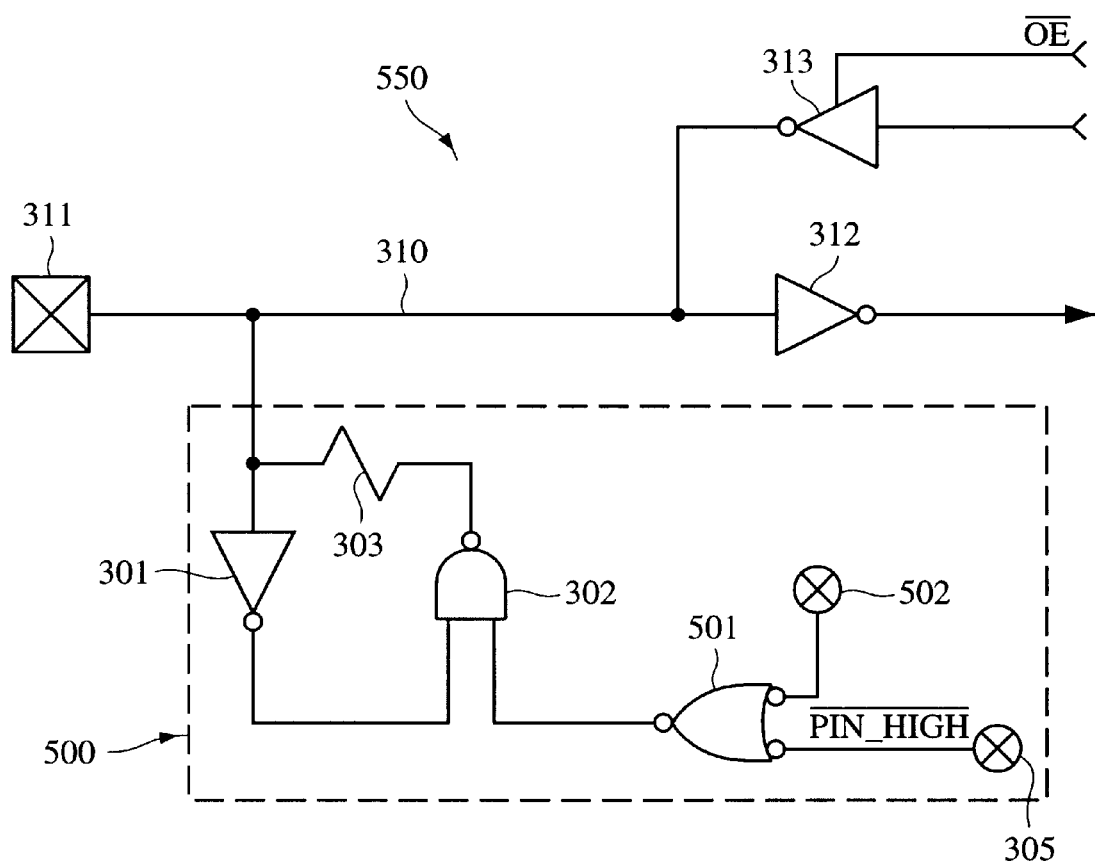
FIG. 5 is a schematic diagram of a bus-hold circuit in accordance with yet another embodiment of the invention.

FIG. 5 is a schematic diagram an ISPLD 550 having a bus-hold circuit 500 in accordance with another embodiment of the present invention. Because ISPLD 550 is similar to ISPLD 350 (FIG. 3), similar elements in FIGS. 3 and 5 are labeled with similar reference numbers. Thus, in addition to the previously described elements of ISPLD 350, ISPLD 550 includes NOR gate 501 (which has two inverting input terminals) and configuration latch 502. The output terminal of NOR gate 501 is coupled to an input terminal of NAND gate 302. A first inverting input terminal of NOR gate 501 is coupled to receive the PIN_HIGH bar signal, and the second inverting input terminal of NOR gate 501 is coupled to receive the signal stored by configuration latch 502.

Bus-hold circuit 500 can be programmed to always operate as a pull-up resistor circuit by loading a logic low value into configuration latch 502. That is, a logic low value provided by configuration latch 502 causes NOR gate 501 to provide a logic low signal to NAND gate 302 (regardless of the state of the PIN_HIGH bar signal). As previously discussed, NAND gate 302 operates as a pull-up resistor circuit in response to such a logic low signal. Such an option is useful in circuits which require that certain pins are continuously provided with a pull-up resistor circuit.

When a logic high value is stored in configuration latch 502, the PIN_HIGH bar signal is effectively passed through NOR gate 501 to NAND gate 302. As a result, bus-hold circuit 500 operates in the same manner as bus-hold circuit 300 (FIG. 3) when a logic high value is stored in configuration latch 502.

Figure 6:
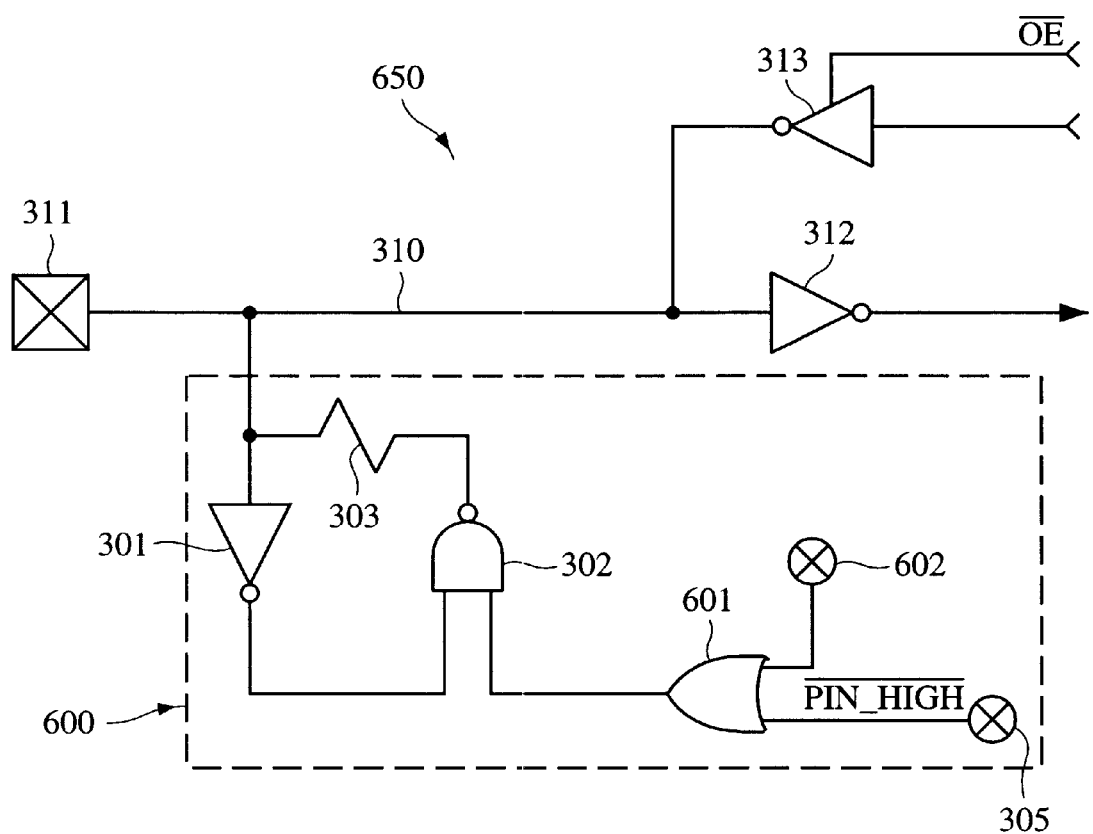
FIG. 6 is a schematic diagram of a bus-hold circuit in accordance with another embodiment of the invention.

FIG. 6 is a schematic diagram of an ISPLD 650 having a bus-hold circuit 600 in accordance with another embodiment of the present invention. Because ISPLD 650 is similar to ISPLD 350 (FIG. 3), similar elements in FIGS. 3 and 6 are labeled with similar reference numbers. Thus, in addition to the previously described elements of ISPLD 350, bus-hold circuit 600 includes OR gate 601 and configuration latch 602. The output terminal of OR gate 601 is coupled to an input terminal of NAND gate 302. A first input terminal of OR gate 601 is coupled to receive the PIN_HIGH bar signal, and the second input terminal of OR gate 601 is coupled to receive the signal stored by configuration latch 602.

Bus-hold circuit 600 can be programmed to always operate as a bus-hold circuit by loading a logic high value into configuration latch 602. That is, a logic high value provided by configuration latch 602 causes OR gate 601 to provide a logic high signal to NAND gate 302 (regardless of the state of the PIN_HIGH bar signal). As previously discussed, NAND gate 302 operates as an inverter in response to such a logic high signal. As a result, bus-hold circuit 600 operates as a conventional bus-hold circuit when configuration latch 602 stores a logic high value. Such an option is useful in circuits which require that certain pins are continuously provided with a bus-hold circuit.

When a logic low value is stored in configuration latch 602, the PIN_HIGH bar signal is effectively passed through OR gate 601 to NAND gate 302. As a result, bus-hold circuit 600 operates in the same manner as bus-hold circuit 300 (FIG. 3) when a logic low value is stored in configuration latch 602. Although the present invention has been described in connection with several embodiments, it is understood that this invention is not limited to the embodiments disclosed, but is capable of various modifications which would be apparent to one of ordinary skill in the art. For example, in one embodiment, two physical circuits are provided, one hard-wired pull-up resistor circuit and one hard-wired bus-hold circuit. In this embodiment, conventional circuitry selects which physical circuit is used. In yet another embodiment, the two physical circuits include two programmable circuits in accordance with the present invention, wherein either circuit can be programmed as a pull-up resistor circuit or as a bus-hold circuit. As in the previous embodiment, conventional circuitry selects which circuit is used. Thus, the invention is limited only by the following claims.

What is claimed is:

1. A method of operating an input/output (I/O) circuit of a programmable logic device (PLD), the method comprising the steps of:

providing a set-up mode before the PLD is fully configured, wherein the I/O circuit functions as a resistor circuit which applies a predetermined voltage to a pin of the I/O circuit; and providing a normal operating mode after the PLD is configured, wherein the I/O circuit functions as a bus hold circuit which maintains the pin at the voltage last applied to the pin, wherein the set-up mode and the normal operating mode are determined by a control signal stored in a configuration latch.

2. The method of claim 1, wherein the set-up mode includes a non-programmed sub-mode and a configuration sub-mode.

3. The method of claim 1, further comprising the step of selectively coupling the pin to an input stage or an output stage.

4. The method of claim 1, wherein the predetermined voltage is a logic high voltage.

5. The method of claim 1, wherein the predetermined voltage is a logic low voltage.

6. An in-system programmable logic circuit comprising:

a pin;

a resistor coupled to the pin;

a first logic gate having a first input terminal and an output terminal coupled to the resistor; and a second logic gate having a first input terminal coupled to a first configuration latch, a second input terminal coupled to a second configuration latch, and an output terminal coupled to a second input terminal of the first logic gate.

7. The circuit of claim 6, wherein the first input terminal of the first logic gate is coupled to the pin through an inverter.

8. The circuit of claim 6, wherein the output terminal of the first logic gate is inverting.

9. The circuit of claim 6, wherein the first logic gate is a NAND gate.

10. The circuit of claim 6, wherein the first logic gate is a NOR gate.

11. The circuit of claim 6, wherein the second logic gate is a NOR gate.

12. The circuit of claim 6, wherein the second logic gate is an OR gate.

13. The circuit of claim 6, further comprising:

an input stage;

an output stage; and a programmable circuit for selectively using either the input stage or the output stage to the pin.

14. The circuit of claim 6, wherein the first and second configuration latches include non-volatile memory cells for storing first and second control signals.

* * * * *